(12) United States Patent
Gravina

(10) Patent No.: US 9,510,486 B1
(45) Date of Patent: Nov. 29, 2016

(54) DATA CENTER COOLING SYSTEM HAVING ELECTRICAL POWER GENERATION

(71) Applicant: Matteo B. Gravina, Laredo, TX (US)

(72) Inventor: Matteo B. Gravina, Laredo, TX (US)

( * ) Notice: Subject to any disclaimer, the term of this patent is extended or adjusted under 35 U.S.C. 154(b) by 0 days.

(21) Appl. No.: 15/209,176

(22) Filed: Jul. 13, 2016

(51) Int. Cl.
*H05K 7/20* (2006.01)
*H05K 7/14* (2006.01)
*H01L 23/473* (2006.01)

(52) U.S. Cl.
CPC ........ *H05K 7/20818* (2013.01); *H05K 7/1488* (2013.01); *H05K 7/20309* (2013.01); *H05K 7/20736* (2013.01)

(58) Field of Classification Search
CPC .............................. G06F 1/181–1/182; H05K 7/20218–7/20381; H05K 7/20409–7/20418; H05K 7/20009–7/202; H01L 23/367–23/3677; H01L 23/473; H01L 23/46–23/467
USPC ....... 361/676–678, 679.46–679.54, 361/688–723; 165/80.1–80.5, 104.33, 185; 174/15.1–15.3, 16.1–16.3, 547, 548; 257/712–722, E23.088; 24/453, 24/458–459; 454/184; 312/236
See application file for complete search history.

(56) References Cited

U.S. PATENT DOCUMENTS

| | | | |
|---|---|---|---|
| 6,516,954 B2 | 2/2003 | Broome |
| 6,574,970 B2 | 6/2003 | Spinazzola et al. |
| 6,594,148 B1 | 7/2003 | Nguyen et al. |
| 6,672,955 B2 | 1/2004 | Charron |
| 6,836,030 B2 | 12/2004 | Smith et al. |
| 6,912,131 B2 | 6/2005 | Kabat |
| 7,086,823 B2 | 8/2006 | Michaud |
| 7,088,583 B2 | 8/2006 | Brandon et al. |
| 7,184,267 B2 | 2/2007 | Patel |
| 7,286,345 B2 | 10/2007 | Casebolt |
| 7,508,663 B2 | 3/2009 | Coglitore |
| 7,534,167 B2 | 5/2009 | Day |
| 7,752,858 B2 | 7/2010 | Johnson et al. |
| 7,869,209 B2 | 1/2011 | Nemoz et al. |
| 7,952,869 B2 | 5/2011 | Lewis, II et al. |
| 7,984,613 B2 | 7/2011 | DuBois |
| 8,040,673 B2 | 10/2011 | Krietzman |
| 8,064,200 B1 | 11/2011 | West et al. |
| 8,154,870 B1 | 4/2012 | Czamara et al. |

(Continued)

FOREIGN PATENT DOCUMENTS

CA 2635304 A1 1/2010

OTHER PUBLICATIONS

Panduit, Panduit Corporation, "Net-SERV® Vertical Exhaust Ducts (VED)", Specification Sheet, www.panduit.com, 2012.

(Continued)

*Primary Examiner* — Anthony Haughton
*Assistant Examiner* — Razmeen Gafur
(74) *Attorney, Agent, or Firm* — Donald J. Ersler

(57) ABSTRACT

A data center cooling system having electrical power generation, which utilizes heat generated by servers to simultaneously cool the data center and generate electrical power. Taking into account the design of the data center and cooling allows heat to dissipate naturally, which by design permits a turbine to rotate thereby generating electrical power from a generator. Using the fundamental phenomena of compressed hot air rising and cool air sinking in a cyclical approach is a force multiplier using the heat energy of the data center against the natural use of elevation temperatures. Variations between the differences in energy amount in the looping cycle of the close loop system allows for a negative power usage effectiveness.

20 Claims, 11 Drawing Sheets

(56) References Cited

U.S. PATENT DOCUMENTS

| | | | |
|---|---|---|---|
| 8,254,120 B2 | 8/2012 | Hasse et al. | |
| 8,300,402 B2 | 10/2012 | Wei | |
| 8,331,087 B2 | 12/2012 | Wei | |
| 8,405,985 B1 | 3/2013 | Reynov et al. | |
| 8,425,287 B2 | 4/2013 | Wexler | |
| 8,456,839 B2 | 6/2013 | Shirakami et al. | |
| 8,472,181 B2 | 6/2013 | Doll | |
| 8,490,397 B2 | 7/2013 | Lehar | |
| 8,522,552 B2 | 9/2013 | Waterstripe et al. | |
| 8,522,569 B2 | 9/2013 | Avery et al. | |
| 8,640,461 B2 | 2/2014 | Thompson | |
| 8,733,103 B2 | 5/2014 | Paya Diaz | |
| 8,867,204 B1 | 10/2014 | Gardner | |
| 8,922,992 B2 | 12/2014 | Shah et al. | |
| 9,072,195 B2 | 6/2015 | Kameno et al. | |
| 9,084,369 B2 | 7/2015 | Lewis, II et al. | |
| 9,141,156 B2 | 9/2015 | Ross et al. | |
| 9,167,724 B1 | 10/2015 | Somani et al. | |
| 9,204,576 B2 | 12/2015 | Goulden et al. | |
| 9,215,831 B2 | 12/2015 | Hao et al. | |
| 2002/0020682 A1* | 2/2002 | Broome | H05K 7/186 211/26 |
| 2002/0059804 A1* | 5/2002 | Spinazzola | G06F 1/20 62/259.2 |
| 2007/0017658 A1* | 1/2007 | Lehman | H05K 7/20254 165/80.4 |
| 2007/0074525 A1 | 4/2007 | Vinson et al. | |
| 2007/0242438 A1* | 10/2007 | Belits | F28D 15/0266 361/700 |
| 2007/0297136 A1* | 12/2007 | Konshak | H05K 7/20772 361/699 |
| 2008/0158818 A1* | 7/2008 | Clidaras | G06F 1/206 361/699 |
| 2008/0204999 A1* | 8/2008 | Clidaras | H05K 7/20745 361/696 |
| 2008/0205003 A1* | 8/2008 | Belady | H05K 7/2079 361/700 |
| 2008/0209931 A1* | 9/2008 | Stevens | H05K 7/20763 361/699 |
| 2008/0266794 A1* | 10/2008 | Malone | H05K 7/20745 361/695 |
| 2009/0061755 A1 | 3/2009 | Calder et al. | |
| 2009/0229283 A1* | 9/2009 | Marsala | H05K 7/20809 62/119 |
| 2010/0024445 A1 | 2/2010 | Cichanowicz | |
| 2011/0056660 A1 | 3/2011 | Aybay et al. | |
| 2011/0063792 A1* | 3/2011 | Schmidt | G06F 1/20 361/679.46 |
| 2011/0096503 A1* | 4/2011 | Avery | F25B 27/02 361/701 |
| 2011/0138708 A1 | 6/2011 | Chazelle et al. | |
| 2011/0154842 A1* | 6/2011 | Heydari | H05K 7/20836 62/259.2 |
| 2011/0239683 A1 | 10/2011 | Czamara et al. | |
| 2011/0317367 A1* | 12/2011 | Campbell | H05K 7/20809 361/700 |
| 2012/0012283 A1* | 1/2012 | Bean, Jr. | H05K 7/20745 165/104.33 |
| 2012/0026691 A1* | 2/2012 | Campbell | H05K 7/20781 361/700 |
| 2012/0075794 A1 | 3/2012 | Wei et al. | |
| 2012/0127653 A1* | 5/2012 | Keisling | H05K 7/20827 361/679.46 |
| 2012/0140404 A1* | 6/2012 | Peterson | G06F 1/20 361/679.47 |
| 2012/0201005 A1* | 8/2012 | Barringer | H05K 7/20736 361/701 |
| 2013/0068423 A1* | 3/2013 | Campbell | H05K 7/20136 165/104.14 |
| 2013/0128455 A1* | 5/2013 | Koblenz | G05D 23/1917 361/692 |
| 2013/0188316 A1* | 7/2013 | Eagle | H05K 7/20254 361/702 |
| 2013/0213071 A1* | 8/2013 | Takahashi | F24F 12/002 62/238.6 |
| 2014/0014153 A1 | 1/2014 | Onose | |
| 2014/0185225 A1 | 7/2014 | Wineland | |
| 2014/0218861 A1* | 8/2014 | Shelnutt | G06F 1/20 361/679.53 |

OTHER PUBLICATIONS

Chatsworth Products, Inc., "Ducted Exhaust Cabinet-Managing Exhaust Airflow Beyond Hot Aisle/Cold Aisle", Cabinets: Thermal Management, White Paper, www.chatsworth.com, 2009.

"Elsevier Journal, ""Energy Conversion and Management"", Thermodynamic feasibility of harvesting data center waste heat to drivean absorption chiller, Anna Haywood, Jon Sherbeck, Patrick Phelan, Georgios Varsampoulos, Sandeep K.S.Gupta, www.elsevier.com/locate/enconman, 2012".

Chatsworth Products, Inc., "CPI Passive Cooling® Solutions: A Path to Higher Density and Lower Cost", CPI Thermal Management, White Paper, Ian Seaton, www.chatsworth.com, 2009.

Applied Methodologies, Inc., "The Case for Thermoelectrics in the Data Center", A new approach and use of an old science, AMILBAS Research, Jeffrey J. Sircuranza, 2009.

Pentair, Pentair Technical Products, "Overview & Design of Data Center Products:" www.pentairtechnicalproducts.com, 2010.

Schneider Electric, APC, "Air Distribution Architecture Options for Mission Critical Facilities", White Paper #55, Neil Rasmussen, www.apc.com, 2003.

* cited by examiner

DATA CENTER COOLING SYSTEM HAVING ELECTRICAL POWER GENERATION

BACKGROUND OF THE INVENTION

1. Field of the Invention

The present invention relates generally to electrical power generation and more specifically to data center cooling system having electrical power generation, which utilizes heat generated by servers to cool the data center and generate electrical power.

2. Discussion of the Prior Art

The advent of the computer desktop brought about opportunities and freedoms as well latitude in personal and work time. During the decade of the eighties and nineties, the exponential growth of desktops started to acclaim to everyday life. Education started to use computers for teaching on hardware and software while in the business world computers started to appear to increase productivity. As computers became the norm in everyday life, they started to get more sophisticated which lead to the next step in computer technology, network connectivity.

As a result of the computer network, the logarithmic growth allow society to have freedoms and receive a better quality of life. The next step in computer technology was the interconnection of networks; as a result, the internet came into play. Now with the internet, networks could connect via new software and hardware technologies. The next step brought upon the spread of the internet was the data center, which nowadays is the where most of the information and data that is the internet resides. Broadband, Wi-Fi and cellular technology now allows mobile users to move about and request data from these data centers, which in kind has led to an exponential growth of data centers all over the world. Due to the exponential growth in size, one aspect which has contributed to a major problem is the use of energy for cooling large arrays of rack servers. Although problems with security, location, and size are a major factor, companies have tried to promote consolidating of solutions to their users, as a way to provide a green data center. The use of virtualization, co-location, and use of the natural ability of using nature as for cooling aspect of data centers. The data center of today still has the fundamental task of targeting the lowest power usage effectiveness in their business model.

A fundamental inability of the grouping of servers in a rack enclosure is the dismal approach of force fanning in order to expel heat energy from within the server rack. The approach of placing multiple servers in series in a horizontal plane culminates in adding additional fans on the server rack enclosure and cooling apparatuses providing the force cooling. This fundamental approach adds to the amount of energy require, not only because heat is dissipated in the horizontal plane, which is counterintuitive to the natural phenomena of heated air to move naturally up.

Yet another approach to removal of heat accumulated by few hundred to thousands of servers is the use of green energy. This approach takes into effect by using the natural thermal conditions of air and water in certain geographical locations. This approach takes into account the seasonal times, whereas the cold air of the winter increases the efficiency by naturally cooling a data center. In addition, use of hydropower as a means of using the power derive as a fundamental approach of using green energy of hydropower as an acceptable approach. Although, both approaches are viable, they neglect to take into account the use of cool air during seasons only. In addition, the use of hydropower is viable as long as the power is continuous, although due to climate changes or droughts not all locations are able to use hydropower on a twenty-four hour a day, three hundred sixty five days of the year for years onward.

Recently another approach of cooling data centers or dissipating the heat accumulated by hundreds to thousands of servers in a data center is the use of immersion cooling. Although, not a novel approach the immersion of electronic motherboard servers and related equipment and dipping them in a liquid solution does alleviates the heat from accumulating at the sources, it has to take into account that not all servers are made alike specifically with the materials of all electronic components. Other fundamental shortcomings of immersion cooling is the limitation to using disk drives whereby a cooling liquid solution could be catastrophic if the particular hard disk at a particular time being use is open. Another fundamental hurdle is the movement physically of servers and racks from use for maintenance or malfunction; it is not as easy as moving the servers or components in an open-air room.

SUMMARY OF THE INVENTION

Accordingly, besides the objects and advantages of the present invention to provide a production of energy with the heat obtain through electrical conductivity and processing by servers, is an object of the present invention to produce electricity generated by the heat accumulated by the servers and use the difference in temperature with air within the close loop system. As the heat generated by the servers in the silos, it will be use with cold air on an opposite side of the close loop. The cold air of the close loop system is obtain by the location of a condenser in an elevated location where the temperature is much colder than at the silos. The close loop system therefore will allow the cyclical movement of the air within the close loop.

Therefore, it is an object of the present invention to provide an arrangement of one, or more than one silo, preferably underground. The silos will allow the server racks to have a set of servers align vertically without server cases. The servers will permit the flow of air upward and with use of the evaporator oval design to move the heated air to the thermal vents. Hence, an advantage of the present invention allows the free movement of heated air by the servers to move freely within the server racks towards the silo encapsulation wall without the use of force fanning present today in server farms.

Thereof, it is an object of the present invention to provide a consolidated thermal line whereby the accumulation of compress hot air can reside under pressure. Therefore, the accumulated pressurized compress hot air naturally flows upward through a main. The compress hot air under pressure is then cooled by a heat exchanger at an elevation whereby the natural ambient cools the air inside of the heat exchanger. Hence, an advantage of the present invention allows for the compress hot air flowing naturally towards the heat exchanger to cool the compress hot air residing inside of it. The design and elevation of the heat exchanger dissipates the heat through its design and the natural flow of air passing through its condenser plates. The heat exchanger eliminates the need for air mass movement through force fanning as such the case in present day data centers.

Yet, it is an object of the present invention to provide cold condense compress air under pressure to move downward in elevation. The cold condense compress air under pressure therefore is far denser than the air moving upwards before staging in the heat exchanger. The density of the cold condense compress air naturally flows downward with force as it is push by the air moving towards the heat exchanger and the natural order of cold air to drop downwards. The natural phenomena of fast moving cold condense compress air moves down the elevation line; therefore, it is advantages of the present invention to utilize the fast movement of the cold condense compress air to provide kinetic energy on a turbine and generator residing inside the thermal energy converter.

Yet, it is an object of the present invention to provide an increase in density by a pressurize line that increases the pressure of the air in the system, therefore the cold condense compress air moving downward kinetic energy increases. Therefore, it is an advantage of modifying the air density in the system in order to take advantage of the increase in energy as denser air retains when heated and releases when changing to a colder temperature. In consequence, the amounts of energy in heat absorb from electrical productivity by the air in the system and the opposite amount of release in consequence of the cold temperature in an elevated region reacts as a force multiplier.

Thereof, it is an object of the present invention to use the pressure line to change the composition of the air, therefore to change the chemistry, in order to decrease or increase the humidity of the gaseous compound. In consequence, the object is also change the chemistry in order to increase or decrease energy transfer of the gaseous compound. In addition, it is the object of the pressure line to change the chemistry of the gaseous compound in order to change the speed of extraction of energy from the servers. In a compounded manner, it is an advantage of the present invention to change the rate of energy production from the system through the variations in chemistry of the gaseous compound in the system.

Furthermore, it is an object of the present invention to produce its own energy from the differential in temperature from the silos to the heat exchanger. As the amount of energy from the silos that accumulates moves through the system is accelerated due to the natural phenomena of compress hot air to rise, and the natural effect of the heat exchanger to discharge the heat energy, force multiply the accelerated of pressurize cold condense compress air to move downward to the thermal energy converter, it is therefore an advantage of the present invention to create electrical energy from its own source unlike prior art. It is in effect that the present invention can generate electrical power for use internally back to the servers and related electrical components, or use the electricity generated to a foreign local. The advantage of generating its own power further reduces the power usage effectiveness of the data center. Under ideal circumstances whereas the amount of heat energy provided by the servers is far in amount in energy content to the opposing air at higher elevations and in particular the heat exchanger that the amount of energy use in the data center is exceeded by the amount of energy in electrical power produce therefore attributing to a negative power usage effectiveness.

In so far, it is an object of the present invention to recycle the downward cold condense compress air and move it back to the silos. Therefore the design allows small pituitary lines to force air onto the evaporators align with the server racks, while the rest of the cold condense compress air moves from below the silos. Therefore it is an advantage of the present invention to recycle the air in the system by natural means as oppose to prior art whereas recycle air is by means of force. The natural phenomena of compress hot air to rise promotes a suction force thereby creating a natural force which recycles the energy in the air mass as it completes a full circle inside the semi-hermetic air line.

In so far, an object of the present invention is to reduce greenhouse gases by using heat energy byproduct to produce its own energy for the data center internal use and to export an excess amount to other places. Therefore, an advantage of the present invention is to take advantage of its own energy production from the heat energy produce and reduce the total amount of electrical energy use by the data center in order to reduce anthropogenic human influence on the environment.

DETAILED DESCRIPTION OF THE PREFERRED EMBODIMENTS

Various aspects in detail of the present invention are shown in the following description in accordance with the present invention. In accordance with the design of data centers one of the biggest obstacles is to remove heat energy that accumulates with time. The present invention will show not only how to remove heat energy from a building but also to use the heat with various proven anomalies use in advantage towards producing power from the heat and natural occurrence of the absence of heat present in high terrestrial elevations.

Figure 1:
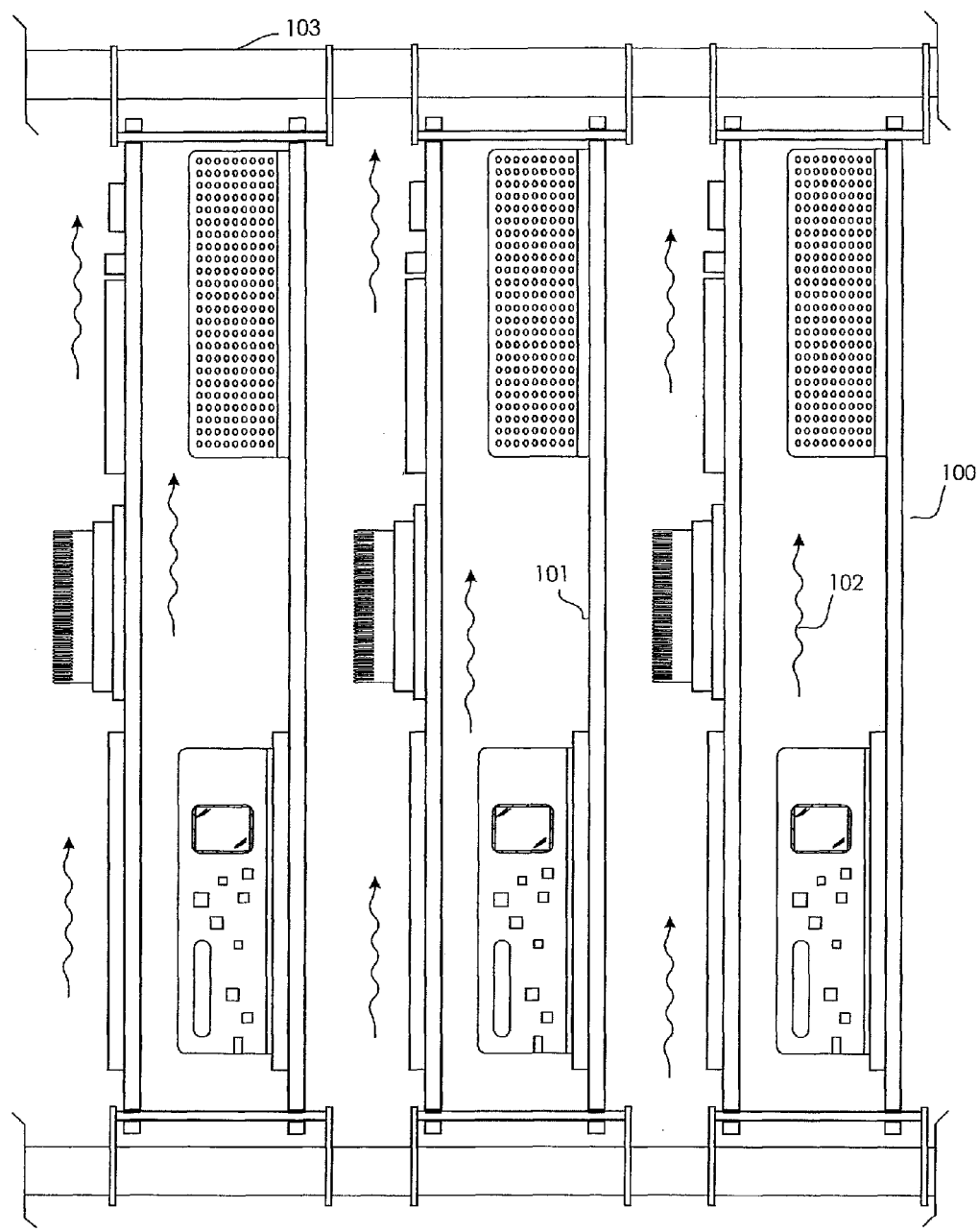
FIG. 1 is a side view of servers without a case; aligned parallel to each other sideways on two rail rods.

FIG. 1 is a close-up end view of a plurality of servers 100 aligned at ninety-degree angles in order to let the natural occurrence of heat to release upward. Natural flow of heat emanating from the plurality of servers 100 will create server thermals 102 to move upward. The motherboard 101 having all electronic subcomponents will conduct heat from electrical activity. Having a plurality of servers 100 in the previously mentioned configuration allows heat to move upward along the plurality of servers 100, which are retained between a pair of server rails 103.

Figure 2:
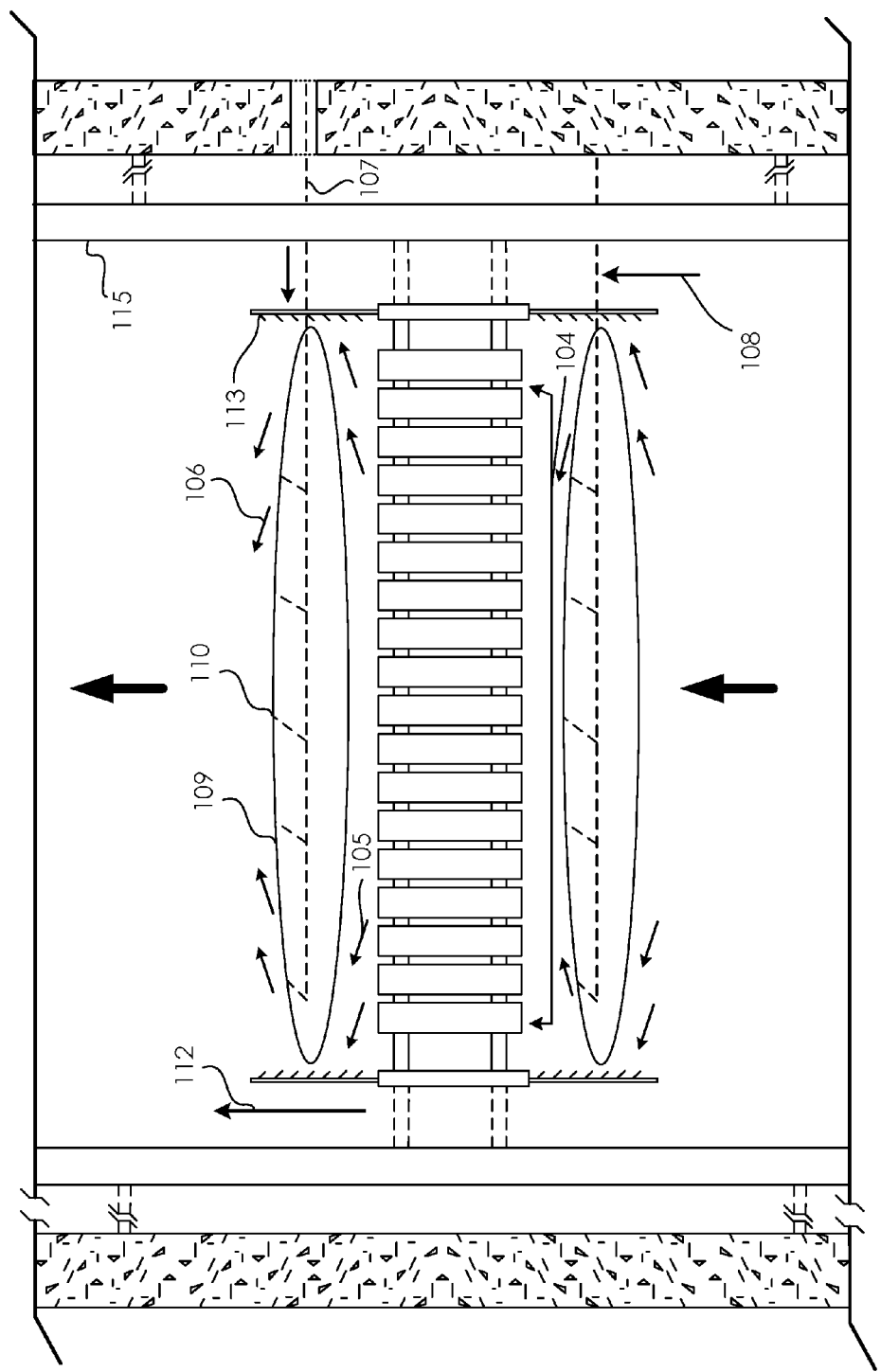
FIG. 2 is a set of servers aligned parallel to each other sideways on rail rods with evaporator coolers located above and below the set of servers.

FIG. 2 is a side view of a server rack 104 with a plurality of servers 100, which together create a pocket of heat of which with natural occurrence allows for an accumulation of server rack thermal 105 to naturally dissipate upward. A special design evaporator 109 with an oval bottom pushes the server rack thermal 105 to the sides onto thermal vents 113 which in turn pushes the heat outward from the server rack 104. The evaporator 109 top is equally oval as the bottom half, which in turn has several capillary openings 110 that allow cool air 106 to slip out coming from the cool air line 107. In order to prevent the natural occurrence of heat from accumulating, the evaporator 109 resides on top of the server rack 104 and another will reside below the server rack 104 in order to introduce the cool air 106 to substitute the departing server rack thermal 105 air. The server rack thermal 105 air that departs outward through the thermal vents 113 gradually accumulates on the sides that together with more air that is heated coming from other thermal vents 113 accumulates on the sides. The left side thermal 112 and the right side thermal 108 gradually accelerate in speed upward within the silo encapsulation wall 115. This process perpetuates the movement of heated air by creating a coriolis effect within the silo encapsulation wall 115.

Figure 3:
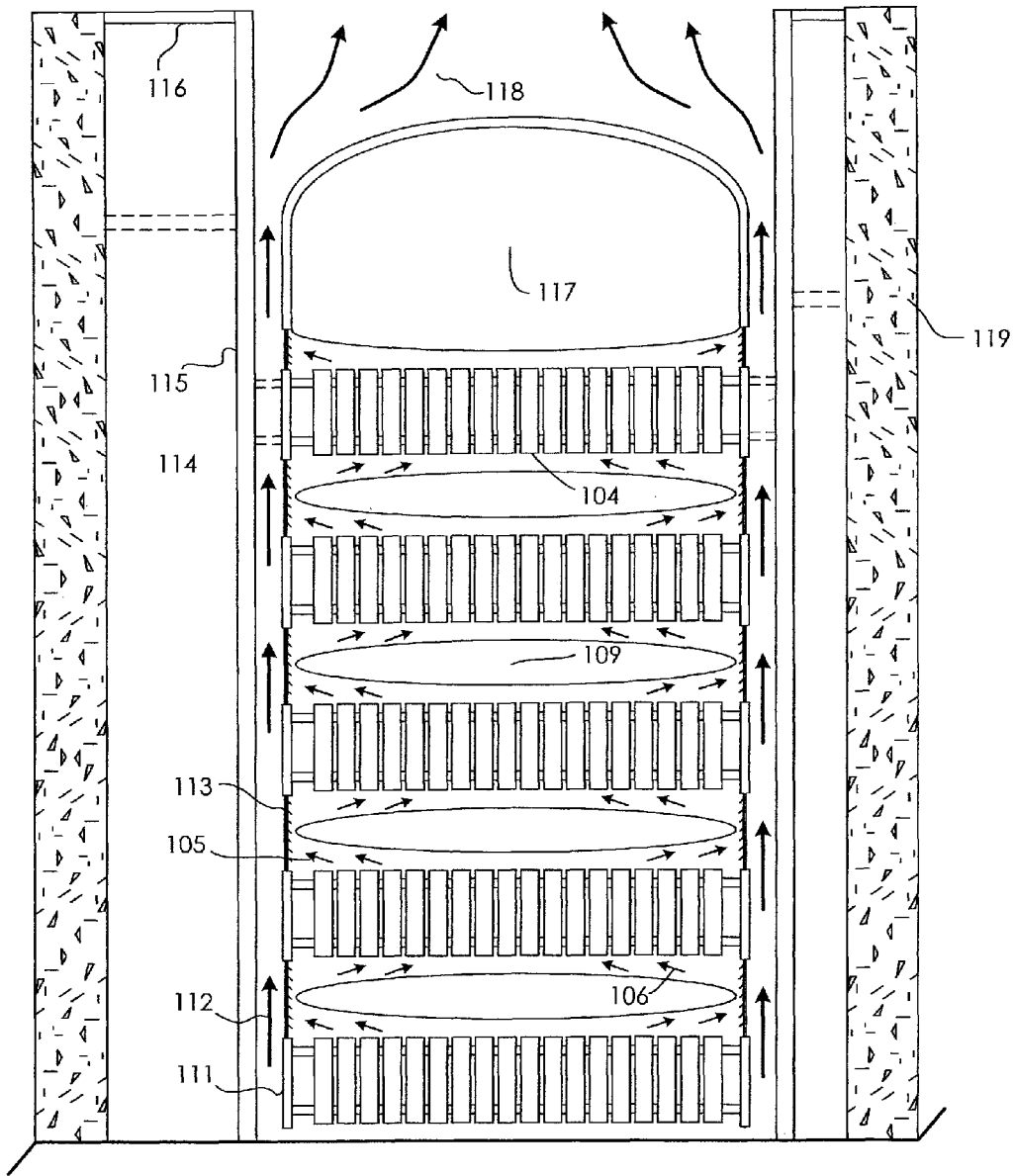
FIG. 3 a side view section of a silo exemplifying how the server rod-configure racks are align.

FIG. 3 is a side view of multiple server racks 104 and evaporators 109. Together align in that sequence in accordance to FIG. 3, which permits a strong rapid movement of venting air. In FIG. 3 coming from the bottom side, a strong wind pattern perpetually moves heated air upward. At the bottom of FIG. 3 a server rack bracket 111 sustains the server rack 104 and the thermal vents 113 of which in turn the server rack brackets 111 also serve as a deterrence from letting the server rack thermal 105 and the cool air 106 from moving sporadically. Therefore, the server rack brackets 111 keep the movement of air uniformly moving through the thermal vents 113. Having multiple server racks 104 and evaporators 109 in accordance with FIG. 3, the left side thermal 112 and the right side thermal 108 will move rapidly towards the top whereby an air spoiler 117 resides. The silo encapsulation walls 115 will prohibit the fast moving heated air from venting other than upward. On top of the air spoiler 117, compressed hot air 118 will accumulate of which then will leave onto another step in the process. The air spoiler includes a top with a convex or outwardly curving outer surface. Surrounding the silo encapsulation walls 115 is on a side is the access space 114, which is used for letting personnel to work on the servers and pertinent mechanics. The access space roof 116 is the limit between the silo encapsulation walls 115 and the silo wall 119. Keeping the whole structure within the silo encapsulation walls 115 from collapsing with its own weight are metal beams holding them in place.

Figure 4:
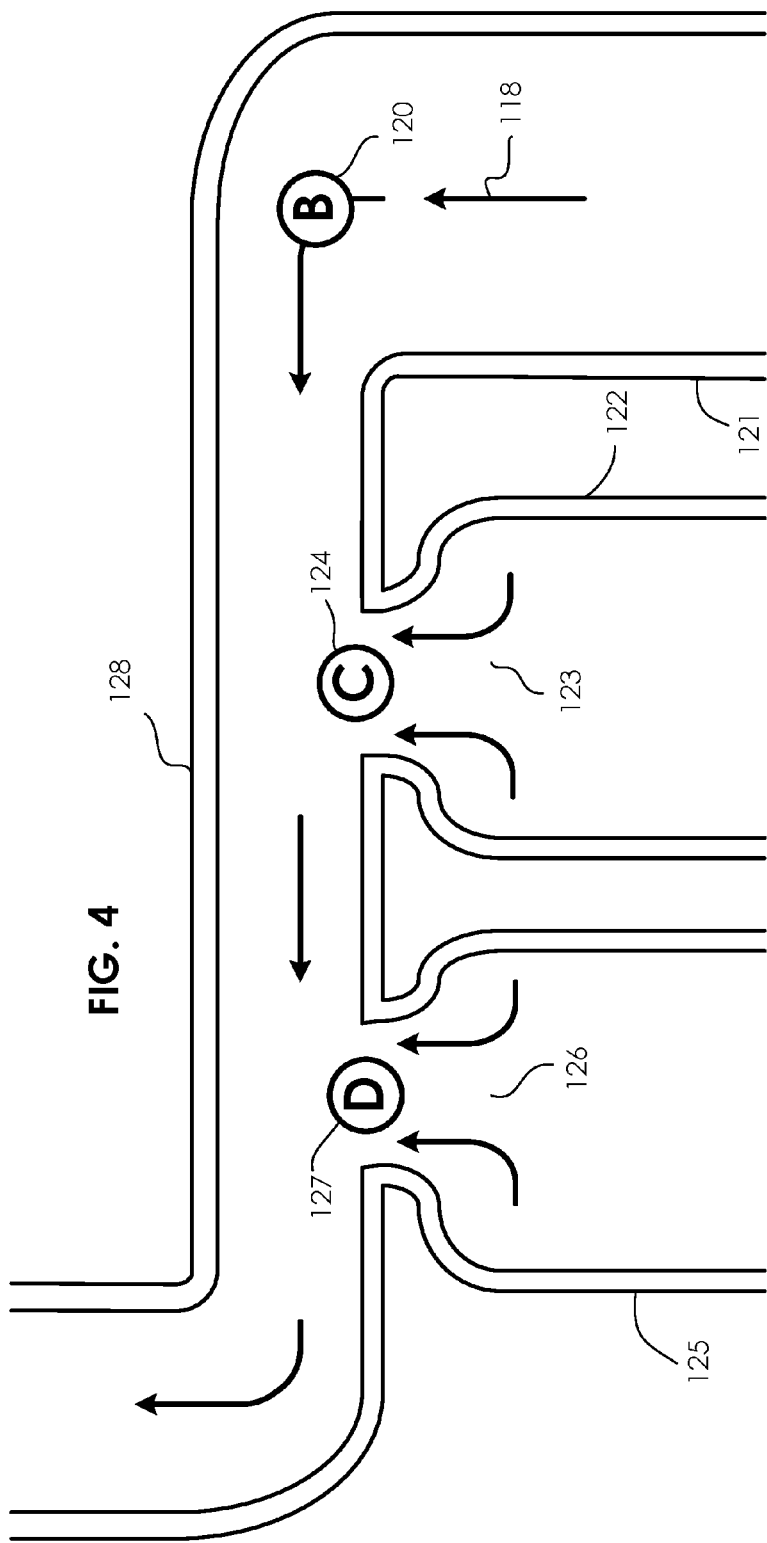
FIG. 4 shows the main line where each silo connects and sends the cumulative heated air mass towards the next stage towards the thermal line.

FIG. 4 shows another step in the process whereby the compressed hot air 118 accelerates to the top of a primary silo 121, in a multi-silo design. At the top of the primary silo 121 is the primary heat accumulator 120, which is the location onto where the compress hot air 118 accumulates. A secondary silo 122 with secondary silo compress hot air 123 will also have a secondary heat accumulator 124. At the left of FIG. 4 is a tertiary silo 125 also with tertiary silo compress hot air 126. Together the primary accumulator 120 with the secondary heat accumulator 124 in conjunction with a tertiary heat accumulator 127 will create even greater compress hot air pressure in the thermal line 128.

Figure 5:
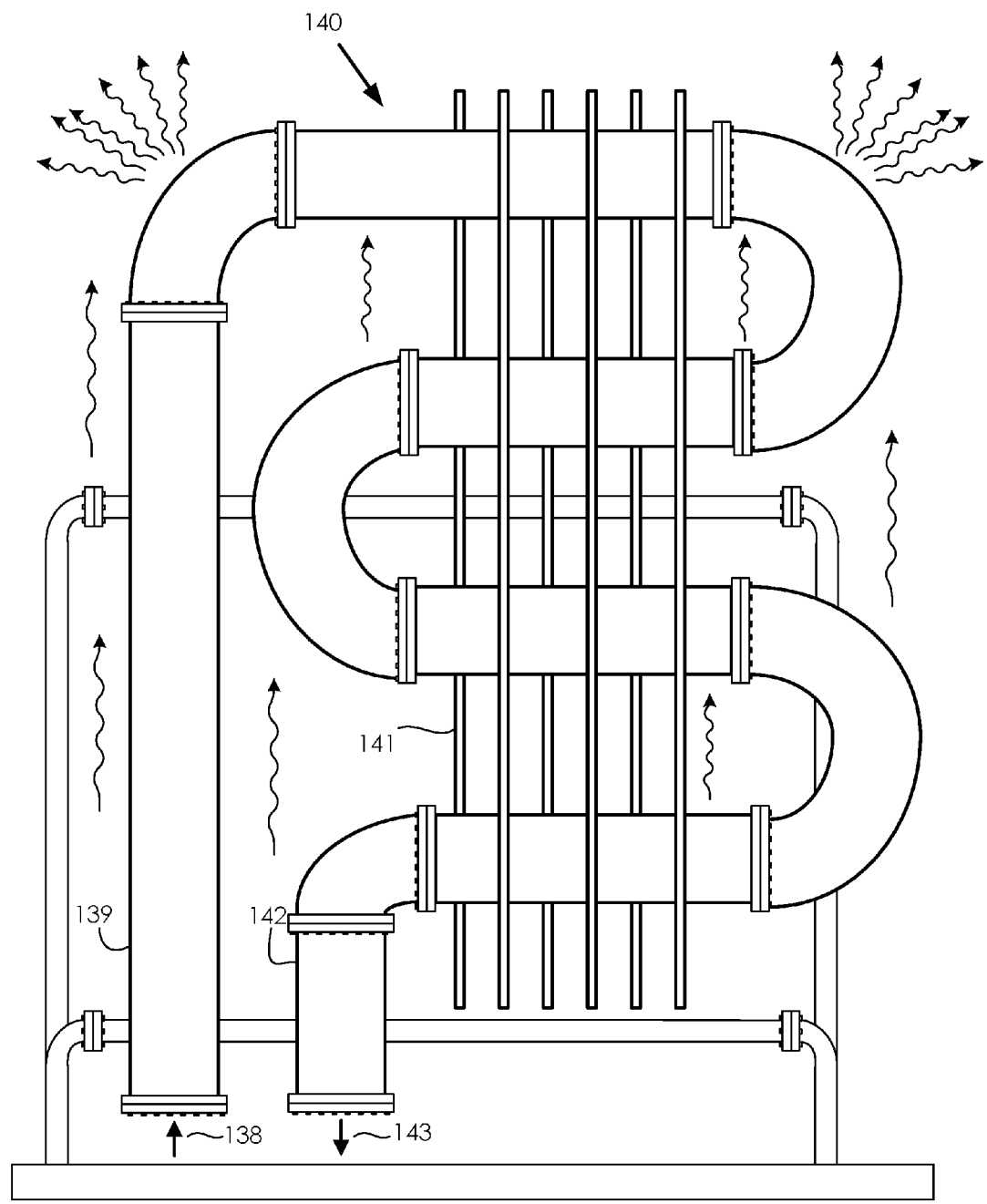
FIG. 5 is a view of the outdoor condenser.
Figure 6:
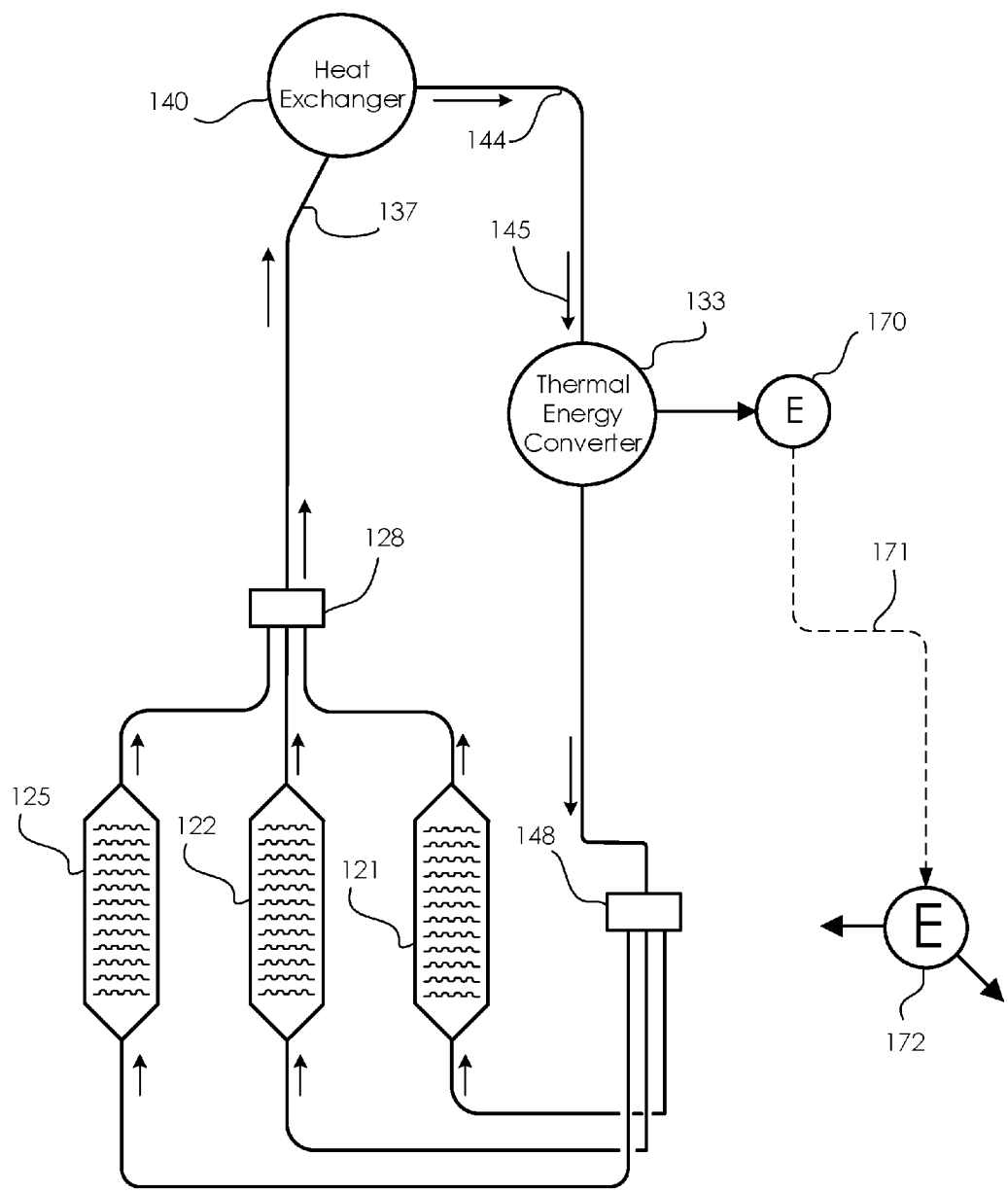
FIG. 6 is a diagram of the present invention process.

FIG. 5 is a heat exchanger 140 residing primarily at a top of a mountain whereby cold air resides. With reference to FIG. 6, the compressed hot air main 137 sends compress hot air 118 up to the heat exchanger 140. The natural behavior of compress hot air 118 to move up accelerates through the compress hot air main 137 to the heat exchanger 140. The compress hot air condenser entry 138 receives the compressed hot air 118 of which then passes through the condenser air entry 139. As the compressed hot air 118 passes through the heat exchanger 140, the compressed hot air 118 will cool and condense, as the temperature of the compressed hot air 118 will cool. As the ambient air with the natural occurrence of wind on top of a high elevation point the heat exchanger 140 is further cooled by condenser plates 141. Once the compressed hot air 118 passes through the heat exchanger 140 it will turn to cold condensed compressed air 145. The cold condense compress air 145 will pass through the condense air main exit 142 and out through the cold air condenser exit 143.

FIG. 6 is a schematic diagram of the invention and process. As the cold condensed compressed air 145 leaves the heat exchanger 140, the cold condensed compressed air 145 moves downward through a cold air main 144 downward to an air basement 148. Before reaching the air basement 148, the cold condensed compressed air 145 goes through the thermal energy converter 133. In lieu of the cold condensed compressed air 145 passing inside the thermal energy converter 133, a wind turbine 132 will create electric power 170. The electric power 170 created will then pass through transmission lines 171 then to the distribution lines 172. The distribution lines 172 allow for recycling of the electric power 170 back to the data center or to the local grid.

The natural movement of cold condensed compressed air 145 moves downward perpetuated by the circulatory motion of the compressed hot air 118 to rise and the cold condensed compressed air 145 to drop downward. From the air basement 148 the cold condensed compressed air 145 moves back to the primary silo 121, the secondary silo 122, and the tertiary silo 125. At the middle of the diagram, the next step is the movement of the compressed hot air 118 as the cold condensed compressed air 145 has already heated by passing through the silos. The compressed hot air 118 passes through a thermal line 128 and onto the compressed hot air main 137 and onto the heat exchanger 140.

Figure 7:
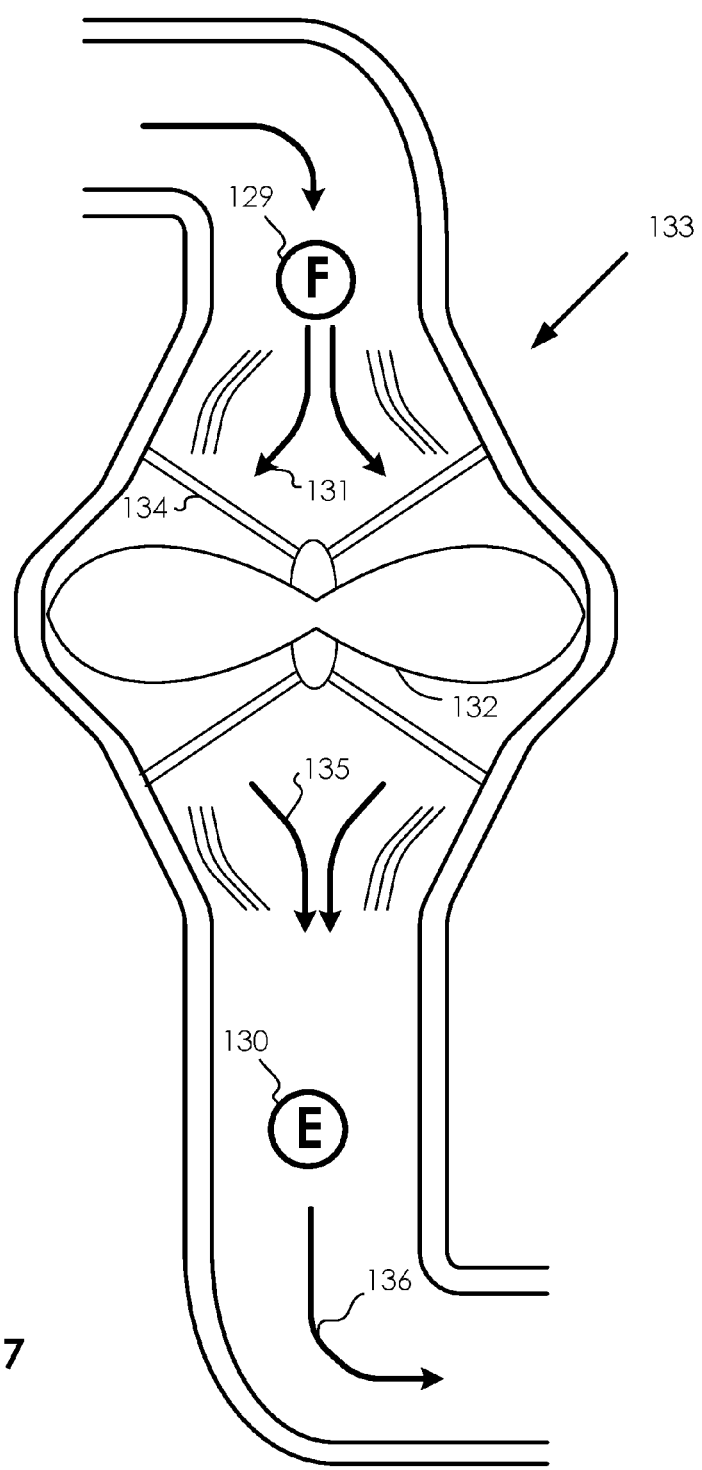
FIG. 7 is the thermal energy converter receiving cold condensed compressed air mass coming from the outdoor condenser.

FIG. 7 illustrates from top to bottom on how the incoming cold condensed compressed air 145 reaches the cold air compression spoiler 129 of which sends the cold condensed compressed air 145 to the coriolis point 131. The coriolis point 131 creates a vortex like swirl due to the internal design. The pressurize cold condense compress air 145 that passes through the coriolis point 131 in turn helps accelerate the movement of a wind turbine 132 residing inside the thermal energy converter 133. Turbine brackets 134 reside inside the thermal energy converter 133 of which has in addition a coriolis decompression point 135 that is a step in itself whereby the cold condense compress air 145 that passes accelerates the vortex like swirl through the cold air accumulation point 130 is compress again before entering the cold air compression spoiler 136.

Figure 8:
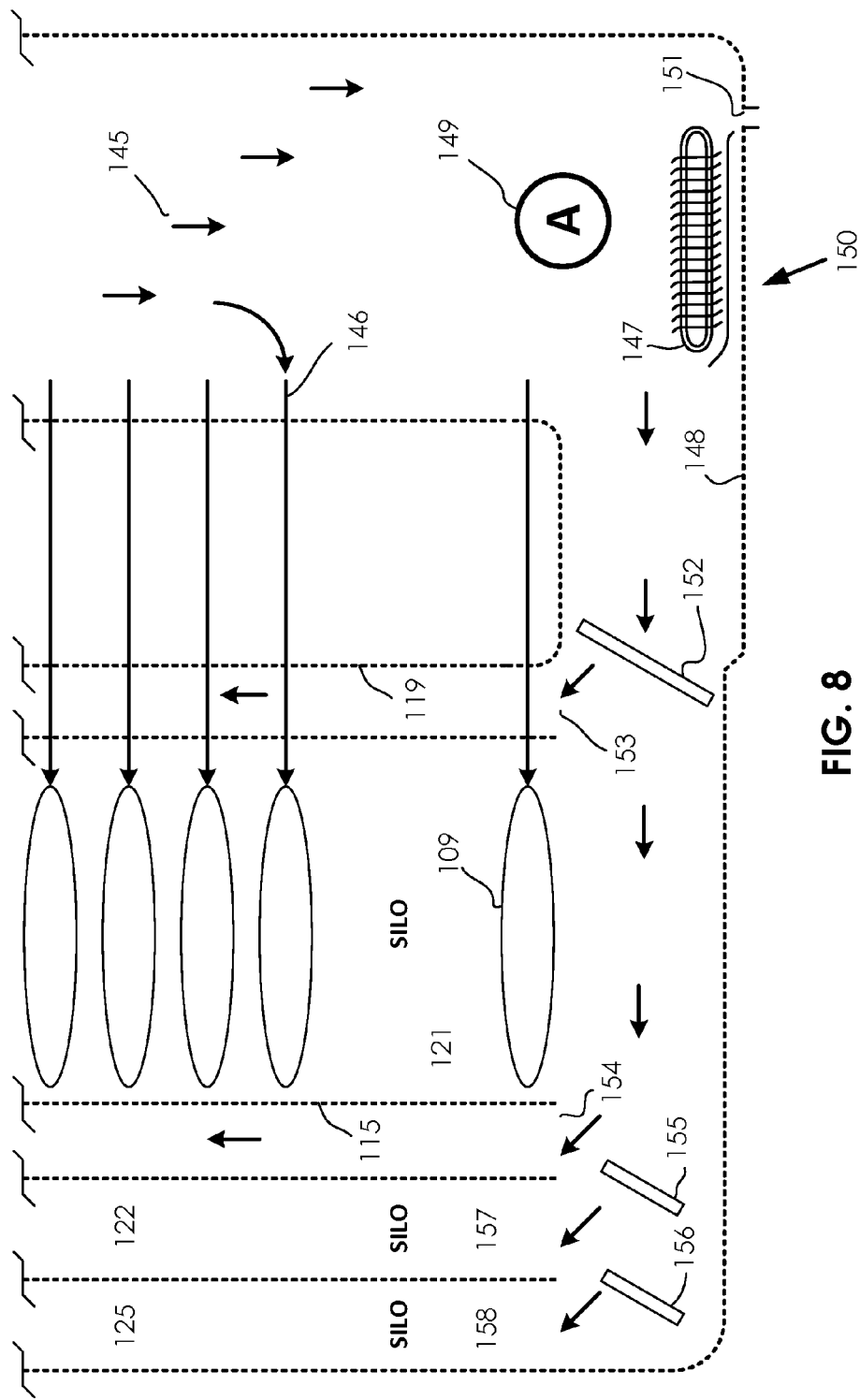
FIG. 8 is a bottom part of the present invention where the cool condense air sinks before moving towards the server silos.

FIG. 8 illustrates how part of the invention process works. As the cold condensed compressed air 145 moves towards the air basement 148, some of the cold condensed compressed air 145 moves through evaporator capillary tube lines 146, which in turn are pushed by the cold condensed compressed air 145 behind coming through the cold air main 144. The same cold condensed compressed air 145 passing through the evaporator capillary tube lines 146 are pulled in by convective forces of which is further perpetuated by the left side thermal 112 and the right side thermal 108 winds. The cold air main 144 reaches the air basement 148 at the bottom end. At the air basement 148 that is the lowest depth of the cycle a cold air condensate pool 149 of cold condensed compressed air 145 resides. A humidity control device 147 resides in the basement. The purpose of the humidity control device 147 is for controlling the amount of humidity in the cold condense compress air 145. The air basement 148 being the deepest part of the process has a drain 151 for water condensation. The subterranean earth 150 is where the air basement 148 resides. Most of the cold condensed compressed air 145 which is not send through the evaporator capillary tube lines 146 passes onwards to the main valve 152. Passing the main valve 152 is the primary silo right entry 153 and the primary silo left entry 154 which together are at the base of the primary silo 121. The purpose of the primary silo right entry 153 and the primary silo left entry 154 is to receive the cold condense compress air 145. Walls that make the primary silo 121 are the silo encapsulation wall 115 which is used to sustain in part the evaporators 109 in place in addition to receive the cold condense compress air 145 from the evaporator capillary tube lines 146. An additional purpose of the silos encapsulation wall 115 in conjunction with the silo wall 119 is to sustain rapid cold condense compress air 145 at the lower level of the primary silo 121 and at the top most level of the silo compress hot air 118 in moving expeditiously and effortlessly. At left of FIG. 8 is the secondary silo air valve 155 which is the valve for allowing cold condense compress air 145 to flow inward through the secondary silo air entry 157 an onto the secondary silo 122. A tertiary silo air valve 156 allows the flow of cold condense compress air 145 into the tertiary silo 125 through the tertiary silo air entry 158.

Figure 9:
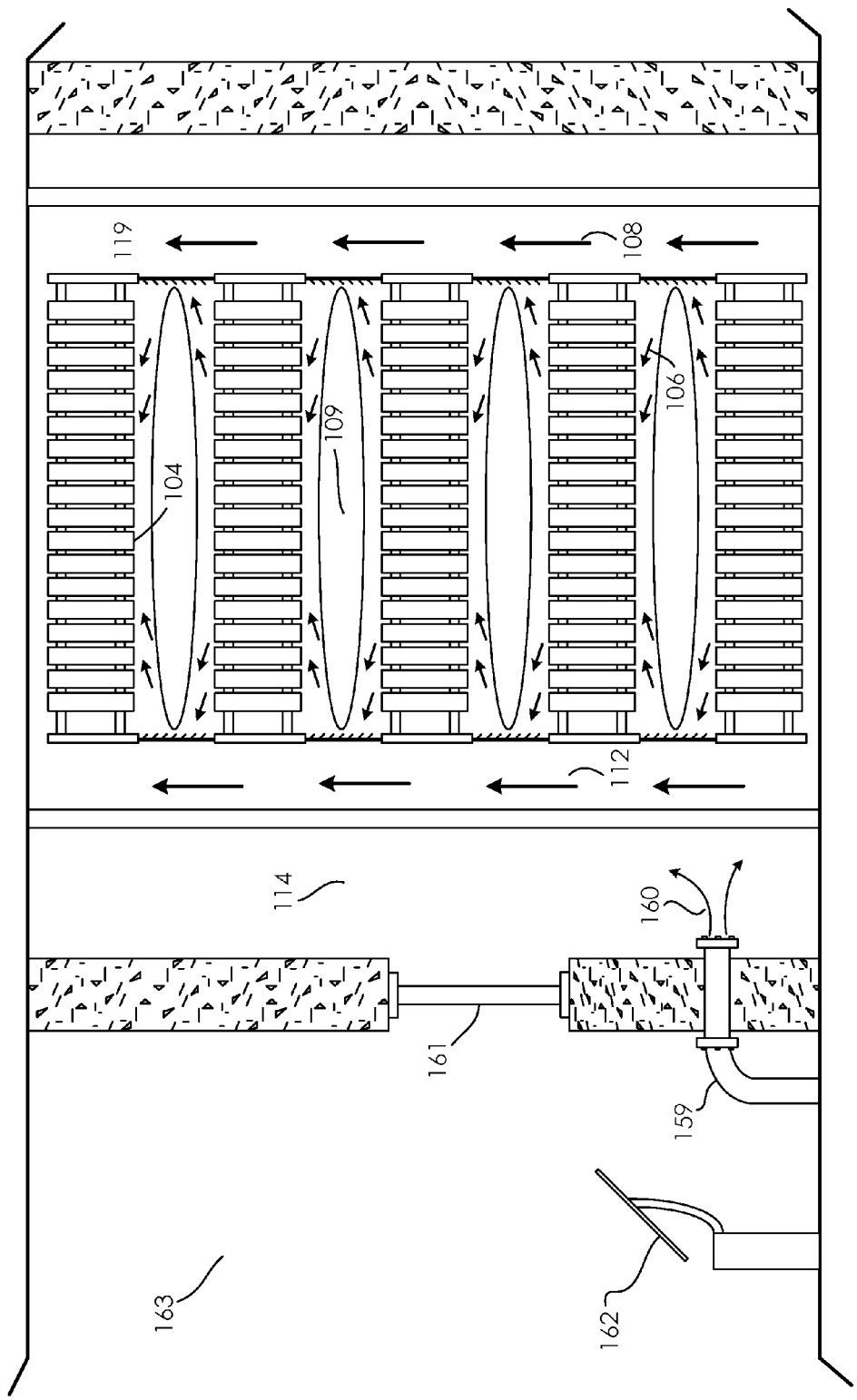
FIG. 9 is a cut view of the command & control room and data center silo.

FIG. 9 is the primary silo 121 back again complementing almost a complete cycle coming from FIG. 8. In FIG. 9 the cold condensed compressed air 145 coming from the air basement 148 is received as it passes through the server racks 104 and the air that did not came directly from the air basement 148 is receive through the evaporator 109. The compressed hot air 118 coming from the server racks 104 is then forwarded upward through the thermal vents 113 as the compressed hot air 118 is accelerated upward by its temperature and the left side thermal 112 and the right side thermal 108. On a left side of FIG. 9 is the access space 114 which is kept pressurized together with compressed hot air 118 and the cold condensed compressed air 145 that circulates. Air 160 is introduced by a compressed air line 159 for the purpose of increasing the amount of air inside the circulatory system. As the air 160 is compressed, the air 160 increases in energy capacity as the energy in the air 160 is able to increase in force inside the thermal line 128 as the compressed hot air 118 density is able to more forcefully through the compressed hot air main 137. An observation window 161 lets personnel in the command & control room 163 observe the primary silo 121. A command & control station 162 lets users oversee operations.

Figure 10:
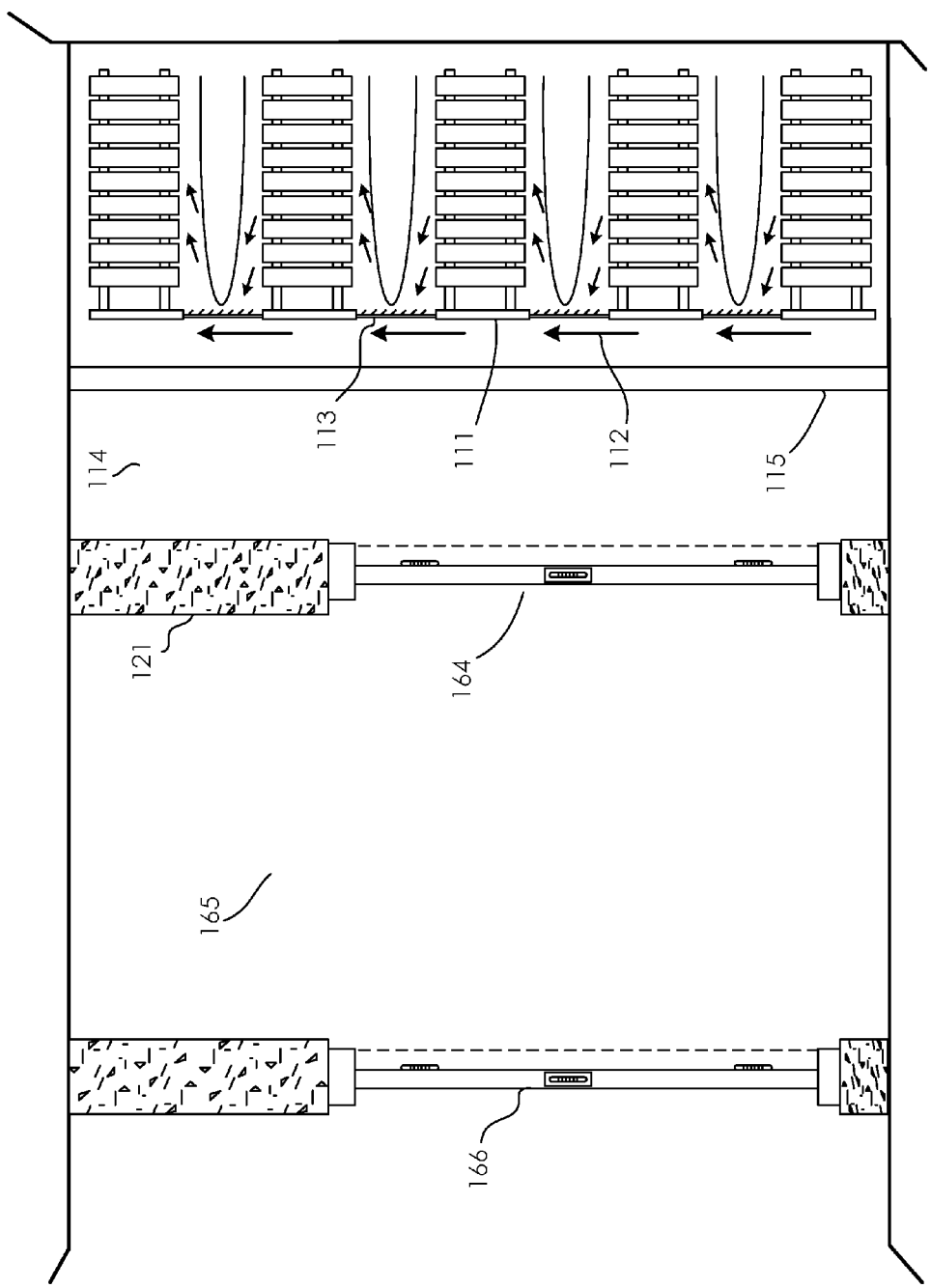
FIG. 10 is a cut side view of the pressure chamber and a silo.

FIG. 10 shows an open view of the primary silo 121 with silo encapsulation wall 115 that controls in part, the movement of the left side thermal 112. The server rack bracket 111 together with the silo encapsulation wall 115 and the thermal vents 113 allow for rapid movement of the compress hot air 118. Left of the access space 114 is a compression room 165 with a primary silo door 164 that allows access to the access space 114. The compression room 165 also has a compression room entry 166 for entry to the compression room 165. The purpose of the compression room 165 is to equalize the air 160 in order to allow personnel to enter the primary silo 121.

Figure 11:
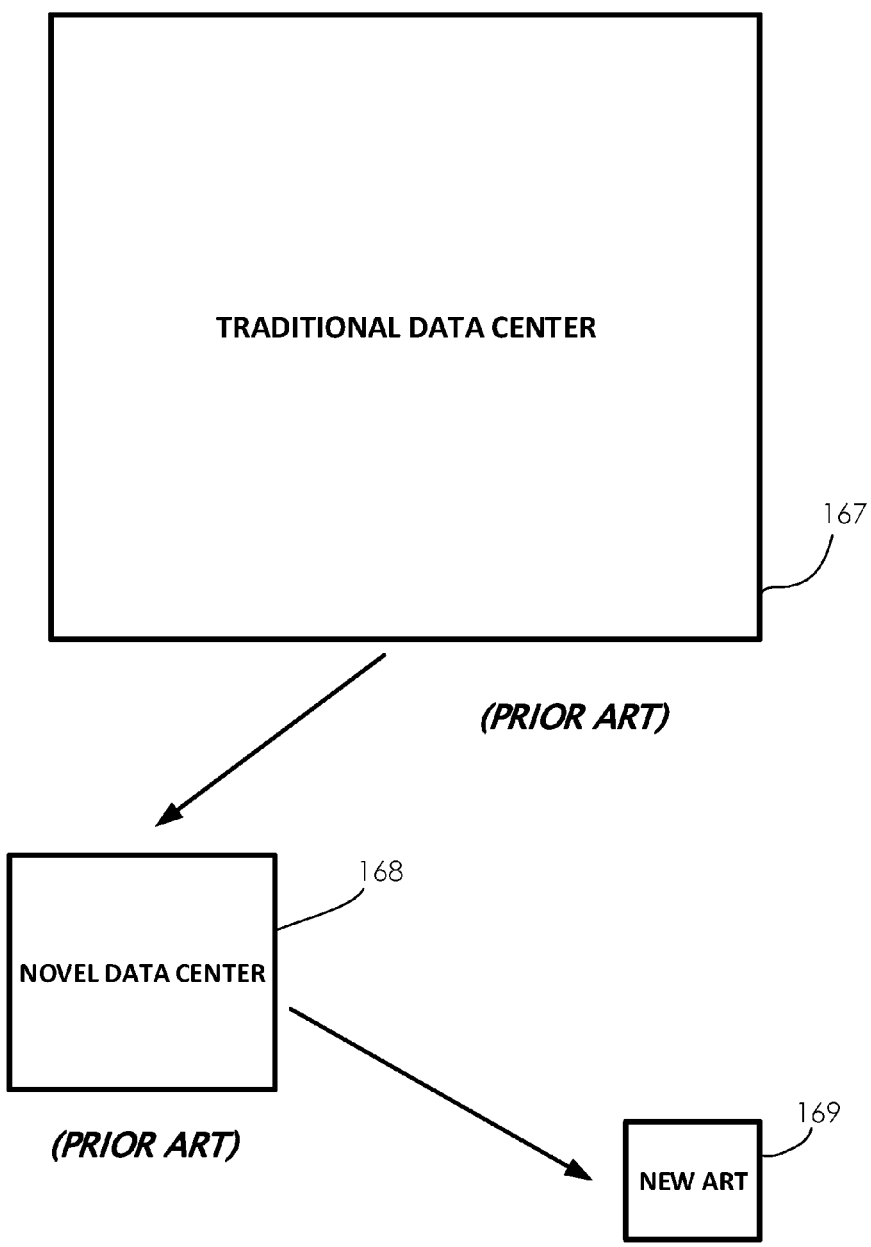
FIG. 11 block diagram of the shrinking in size of comparing a traditional data center in comparison to state of the art technologies coming into use and the comparison the new art of which is the present invention.

FIG. 11 illustrates the comparison of a traditional data center 167 area in space in comparison to a novel data center 168 which is smaller in area due to use of state of the art technologies and process. At the bottom of the illustration in FIG. 11 is the new art 169 as is in this invention an illustration of how much space is area is taken as most of the art in this invention is vertical in application.

While particular embodiments of the invention have been shown and described, it will be obvious to those skilled in the art that changes and modifications may be made without departing from the invention in its broader aspects, and therefore, the aim in the appended claims is to cover all such changes and modifications as fall within the true spirit and scope of the invention.

I claim:

1. A data center cooling system comprising:
    a plurality of electronic device racks each include a plurality of electronic devices;
    a horizontal space is created between a top of a first one of said plurality of electronic device racks and a bottom of a second one of said plurality of electronic device racks;
    an evaporator is retained in said space;
    a first vertical space is created on a first end of said plurality of electronic device racks, a second vertical space is created on a second end of said plurality electronic device racks, wherein heated air from said plurality of electronic device racks flow into said first and second vertical spaces and upward; and
    a heat exchanger is located vertically above a data center, said heat exchanger includes an input and an output, said heat exchanger receives heated air from said plurality of electronic device racks, said heat exchanger outputs cold air, wherein the cold air is fed into said evaporator to cool said plurality of electronic racks.

2. The data center cooling system of claim 1, further comprising:
    a thermal line having a cross sectional input which is larger than a cross sectional output, wherein the heated air is accelerated at said output.

3. The data center cooling system of claim 1, further comprising:
    a humidity control device being located below said first and second vertical spaces.

4. The data center cooling system of claim 1, further comprising:
    an air spoiler is located above said a plurality of electronic device racks, said spoiler includes a top with a convex or outwardly curving outer surface.

5. The data center cooling system of claim 1, further comprising:
    said plurality of electronic device racks are retained in a silo.

6. The data center cooling system of claim 5, further comprising:
    a heat accumulator is located at a top of said silo.

7. The data center cooling system of claim 5, further comprising:
    a valve for controlling the amount of the cold air that is fed into a bottom of said first and second spaces.

8. A data center cooling system having electrical power generation comprising:
    a plurality of electronic device racks each include a plurality of electronic devices;
    a horizontal space is created between a top of a first one of said plurality of electronic device racks and a bottom of a second one of said plurality of electronic device racks;
    an evaporator is retained in said space;
    a first vertical space is created on a first end of said plurality of electronic device racks, a second vertical space is created on a second end of said plurality electronic device racks, wherein heated air from said plurality of electronic device racks flow into said first and second vertical spaces and upward;

a heat exchanger is located vertically above a data center, said heat exchanger includes an input and an output, said heat exchanger receives heated air from said plurality of electronic device racks, said heat exchanger outputs cold air; and a thermal energy converter includes an electric generator which is rotated by falling the cold air, said electric generator outputs electrical power, wherein the cold air is fed into said evaporator to cool said plurality of electronic racks.

9. The data center cooling system of claim 8, further comprising:

a thermal line having a cross sectional input which is larger than a cross sectional output, wherein the heated air is accelerated at said output.

10. The data center cooling system of claim 8, further comprising:

a humidity control device being located below said first and second vertical spaces.

11. The data center cooling system of claim 8, further comprising:

an air spoiler is located above said a plurality of electronic device racks, said spoiler includes a top with a convex or outwardly curving outer surface.

12. The data center cooling system of claim 8, further comprising:

said plurality of electronic device racks are retained in a silo.

13. The data center cooling system of claim 12, further comprising:

a heat accumulator is located at a top of said silo.

14. The data center cooling system of claim 8, further comprising:

a valve for controlling the amount of the cold air that is fed into a bottom of said first and second spaces.

15. A data center cooling system having electrical power generation comprising:

a plurality of electronic device racks each include a plurality of electronic devices;

a horizontal space is created between a top of a first one of said plurality of electronic device racks and a bottom of a second one of said plurality of electronic device racks;

an evaporator is retained in said space;

a first vertical space is created on a first end of said plurality of electronic device racks, a second vertical space is created on a second end of said plurality electronic device racks, wherein heated air from said plurality of electronic device racks flow into said first and second vertical spaces and upward;

a heat exchanger is located vertically above a data center, said heat exchanger includes an input and an output, said heat exchanger receives heated air from said plurality of electronic device racks, said heat exchanger outputs cold air; and a thermal energy converter includes an electric generator which is rotated by falling the cold air, said electric generator outputs electrical power, wherein some of the cold air is fed into said evaporator to cool said plurality of electronic racks and some of the cold air is fed into a bottom of said first and second vertical spaces.

16. The data center cooling system of claim 15, further comprising:

a thermal line having a cross sectional input which is larger than a cross sectional output, wherein the heated air is accelerated at said output.

17. The data center cooling system of claim 15, further comprising:

a humidity control device being located below said first and second vertical spaces.

18. The data center cooling system of claim 15, further comprising:

an air spoiler is located above said a plurality of electronic device racks, said spoiler includes a top with a convex or outwardly curving outer surface.

19. The data center cooling system of claim 15, further comprising:

said plurality of electronic device racks are retained in a silo.

20. The data center cooling system of claim 19, further comprising:

a heat accumulator is located at a top of said silo.

* * * * *